US007279434B2

United States Patent
Hata et al.

(10) Patent No.: US 7,279,434 B2
(45) Date of Patent: Oct. 9, 2007

(54) MATERIAL AND METHOD FOR FORMING LOW-DIELECTRIC-CONSTANT FILM

(75) Inventors: Nobuhiro Hata, Tsukuba (JP); Hidenori Miyoshi, Nirasaki (JP)

(73) Assignees: National Institute of Advanced Industrial Science and Technology, Tokyo (JP); Tokyo Electron Limited, Tokyo (JP)

( * ) Notice: Subject to any disclaimer, the term of this patent is extended or adjusted under 35 U.S.C. 154(b) by 185 days.

(21) Appl. No.: 11/156,570

(22) Filed: Jun. 21, 2005

(65) Prior Publication Data

US 2005/0287818 A1    Dec. 29, 2005

(30) Foreign Application Priority Data

Jun. 21, 2004    (JP)    ............................. 2004-182396

(51) Int. Cl.
*H01L 21/23* (2006.01)
(52) U.S. Cl. ...................... 438/778; 438/788; 438/421; 428/1.23; 428/1.52; 428/1.6
(58) Field of Classification Search ................ 438/778, 438/788, 421
See application file for complete search history.

(56) References Cited

U.S. PATENT DOCUMENTS 6,051,321 A * 4/2000 Lee et al. .................... 428/447

OTHER PUBLICATIONS

Y. Oku, et al., "Novel Self-Assembled Ultra-Low-k Porous Silica Films with High Mechanical Strength for 45 nm BEOL Technology", Proc. IEDM 2003, 4 pages.

* cited by examiner

*Primary Examiner*—Andy Huynh
*Assistant Examiner*—Thinh T Nguyen
(74) *Attorney, Agent, or Firm*—Oblon, Spivak, McClelland, Maier & Neustadt, P.C.

(57) ABSTRACT

The material contemplated by this invention for the formation of a low-dielectric-constant film contains in all the stereoisomer molecules of 1,3,5,7-tetramethyl cyclotetrasiloxane (TMCTS) not less than 15% and not more than 100% of a stereoisomer having all the four hydrogen atoms forming an Si—H bond fall on the same size relative to the Si—O ring plane. It is utilized as a material for forming a low-dielectric-constant film which can be used for enhancing the function of an integrated circuit in the field of semiconductors.

3 Claims, 5 Drawing Sheets

MATERIAL AND METHOD FOR FORMING LOW-DIELECTRIC-CONSTANT FILM

BACKGROUND OF THE INVENTION

1. Field of the Invention

This invention relates to a material and a method for forming a low-dielectric-constant film which can be utilized for enhancing the function of an integrated circuit in the field of semiconductors.

2. Description of the Prior Art

For the sake of enhancing the function of a semiconductor integrated circuit, the circuit is required to lower the dielectric constant of the interlayer dielectric thereof. As a low-dielectric-constant film, the porous insulating film which has the porosity of the interior thereof exalted is widely used. The porous insulating film which is used as a low-dielectric-constant film, however, is generally problematic in betraying weak strength and high hygroscopicity owing to the configuration thereof.

As a means to solve this problem, the technique (TMCTS treatment) of thermally treating a porous silica film in the atmosphere of 1,3,5,7-tetramethyl cyclotetrasiloxane (TMCTS) has been known (Y. Oku et al., "Novel Self-Assembled Ultra-Low-k Porous Silica Films with High Mechanical Strength for 45 nm BEOL Technology," Proc. IEDM 2003, p. 139). This technique is thought to attain enhancement of strength and hydrophobicity by inducing the Si—OH bond contained in the porous silica film and the Si—H bond in the TMCTS to react with each other during the course of the TMCTS treatment as illustrated in FIG. 1.

The elastic modulus Ew of the silica skeleton (silica wall) is theoretically thought to be successfully enhanced to approximately 70 GPa of the magnitude of the elastic modulus of the thermal oxide film. The existing Ew, however, is assumed to be approximately 40 GPa even in the champion data as illustrated in FIG. 2. Thus, the conventional TMCTS treatment is not fully satisfactory and is in need of further enhancement of hydrophobicity and strength.

The present inventors have concluded that one of the reasons for the insufficiency of the conventional TMCTS treatment is ascribable to the insufficiency of the reaction between the Si—OH group in the porous silica film and the Si—H group in the TMCTS and that a new technology is needed for facilitating the progress of this reaction. The present inventors, therefore, have taken notice of the presence of a stereoisomer in the TMCTS and have pursued a study on the molecular structure of the TMCTS stereoisomer which is thought to react readily with the Si—OH bond in the porous silica film.

This invention has been proposed in the light of the true state of affairs mentioned above and is aimed at providing a material and a method for the formation of a low-dielectric-constant film which is possessed of low hydrophobicity and excellent strength.

SUMMARY OF THE INVENTION

With a view to accomplishing the object mentioned above, this invention provides a material for forming a low-dielectric-constant film, which material contains in a stereoisomer of a cyclic siloxane substance represented by general formula,

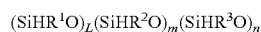

(wherein $R^1$, $R^2$ and $R^3$ may be identical or not identical and individually denote $C_aH_{2a+1}$, $C_bH_{2b+1}O$, $CF_3(CF_2)_cCH_2)_d$, $C_eH_{2e-1}$, $C_6H_5$ or a halogen atom, a denotes an integer of 1 to 3, b an integer of 1 to 3, c an integer of 0 to 10, d an integer of 0 to 4, e an integer of 2 to 4, L an integer of 0 to 8, m an integer of 0 to 8, n an integer of 0 to 8, and a relation of $3 \leq L+m+n \leq 8$ is satisfied), not less than $120/2^{L+m+n-1}\%$ and not more than 100% of a stereoisomer having all (L+m+n) number of hydrogen atoms forming an Si—H bond fall on a same side relative to an Si—O ring plane and provides a method for the formation of the low-dielectric-constant film comprising forming a porous insulating film using the substance.

Then, as the cyclic siloxane substance, the 1,3,5,7-tetramethyl cyclotetrasiloxane (TMCTS) proves most appropriate in consideration of the actual results of use recorded to date. This invention proposes a material for forming a low-dielectric-constant film that contains in all stereoisomer molecules of the TMCTS not less than 15% and not more than 100% of a stereoisomer having all four hydrogen atoms forming an Si—H bond fall on the same side relative to an Si—O ring plane and a method for forming a low-dielectric-constant film comprising forming a porous insulating film using the substance.

With the material for forming the low-dielectric-constant film and the method for the formation thereof which are contemplated by this invention, in the case of adopting the TMCTS as the material, for example, by using the forming material which is made of TMCTS containing in all the stereoisomer molecules of the TMCTS not less than 15% and not more than 100% of an isolated stereoisomer having all the four hydrogen atoms forming an Si—H bond fall on the same side relative to an Si—O ring plane, it is made possible to promote the reactivity of the Si—OH bond present in the porous silica film and the Si—H bond in the TMCTS molecule, decrease the amount of the Si—OH bond remaining in the porous silica film after the TMCTS treatment, and accomplish more enhancement of hydrophobicity and strength than the conventional TMCTS treatment. The same effect as mentioned above is manifested also when the aforementioned cyclic siloxane substance other than the TMCTS is used.

The above and other objects, characteristic features and advantages of the present invention will become apparent to those skilled in the art from the description given below with reference to the accompanying drawings.

DESCRIPTION OF THE PREFERRED EMBODIMENT

This invention consists in using a forming material which is made of a cyclic siloxane substance containing in the stereoisomer of a cyclic siloxane substance represented by the general formula,

(wherein $R^1$, $R^2$ and $R^3$ may be identical or not identical and individually denote $C_aH_{2a+1}$, $C_bH_{2b+1}O$, $CF_3(CF_2)_c(CH_2)_d$, $C_eH_{2e-1}$, $C_6H_5$ or a halogen atom, a denotes an integer of 1 to 3, b an integer of 1 to 3, c an integer of 0 to 10, d an integer of 0 to 4, e an integer of 2 to 4, L an integer of 0 to 8, m an integer of 0 to 8, n an integer of 0 to 8, and the relation of $3 \leq L+m+n \leq 8$ is satisfied), not less than $120/2^{L+m+n-1}$% and not more than 100% of a stereoisomer having all the (L+m+n) number of hydrogen atoms forming an Si—H bond fall on the same side relative to an Si—O ring plane. As a result, it has been ascertained that the use of this forming material brings a significant difference in effect from the use of a cyclic siloxane substance which has not undergone isolation of individual stereoisomers.

Now, the TMCTS as a representative of the cyclic siloxane substances will be explained below.

Figure 1:
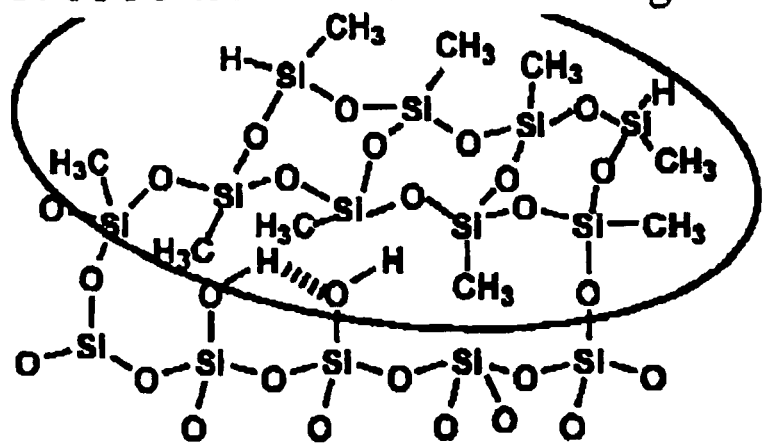
FIG. 1 is a structural drawing illustrating the estimated reaction mechanism of the TMCTS treatment.
Figure 2:
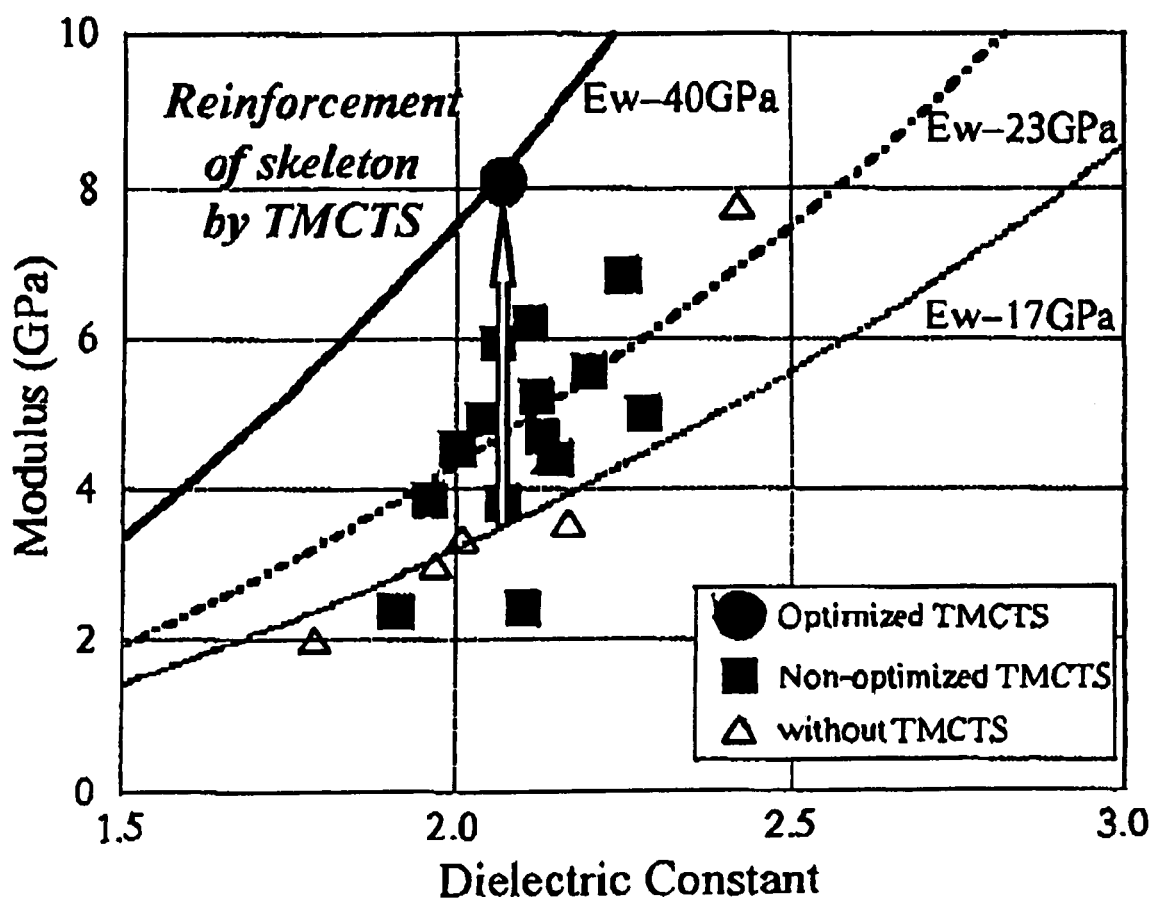
FIG. 2 is a graph showing the relation between the elastic modulus and the dielectric constant of a TMCTS treated film.
Figure 3:
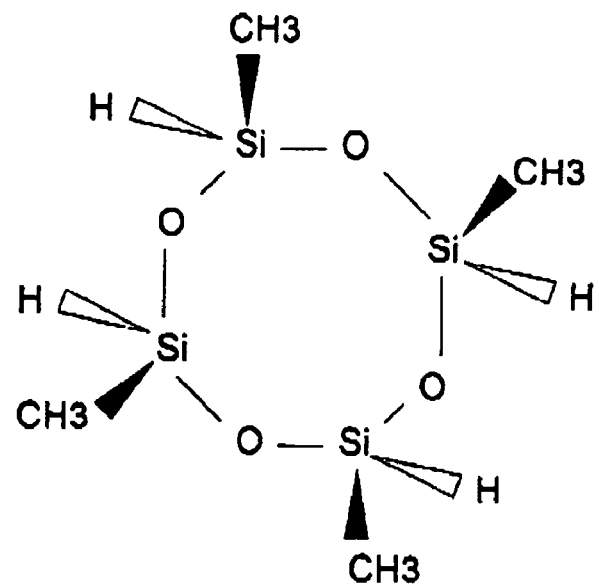
FIG. 3 is a plan view illustrating a stereoisomer structure of TMCTS (wherein the mark ▲ designates that $CH_3$ of the substituent group lies above the ring plane and the mark △ designates that CH of the substituent group lies below the ring plane).

The TMCTS which has undergone no isolation of the individual stereoisomers includes a stereoisomer having the four hydrogen atoms forming an Si—H bond fall severally on the same side relative to an Si—O ring plane and a stereoisomer having only part of them fall on the same side. The latter stereoisomer includes a stereoisomer having only one hydrogen atom fall on the same side and a stereoisomer having two hydrogen atoms fall on the same side. It has been ascertained that the use of a stereoisomer possessed of the structure of FIG. 3, namely a stereoisomer having all the four hydrogen atoms forming an Si—H bond fall on the same side relative to an Si—O ring plane, among other stereoisomers mentioned above results in enhancing the effect of the TMCTS treatment of the porous silica film. The ratio of the stereoisomer possessed of the structure of FIG. 3 contained in the TMCTS having undergone no isolation of the individual stereoisomers is 12.5% based on the calculation of probability. So long as this ratio is not less than the level just mentioned, the effect of the TMCTS treatment of the porous silica film is higher than has been conventionally attained. When this rule is applied to the aforementioned general formula of the cyclic siloxane substance, since the total L+m+n=4 exists, the ratio is found to be $120/2^{L+m+n-1}=15\%$. A further study has found this ratio to be preferably not less than 20% and more preferably not less than 30%.

Figure 4:
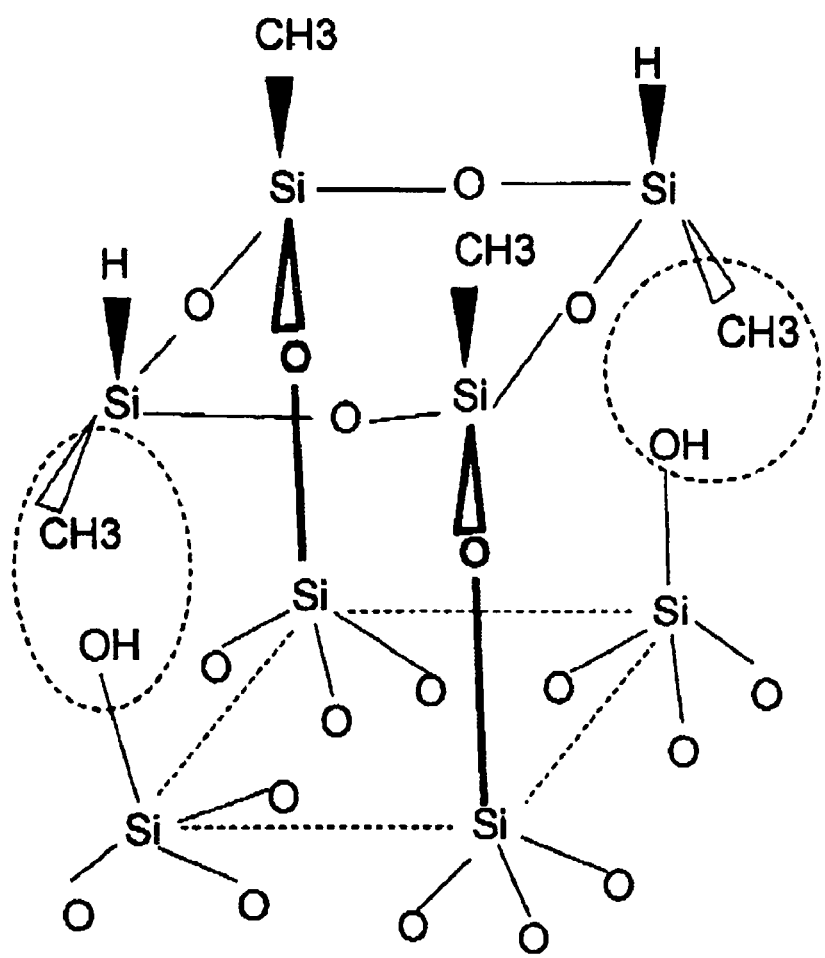
FIG. 4 is a structural drawing illustrating the film surface structure which has undergone the TMCTS treatment with a TMCTS having no isolated stereoisomer (with insufficient reaction of the Si—OH of the film surface and TMCTS).

When the conventional TMCTS which has undergone no isolation of the individual stereoisomers is used, the reaction between the Si—OH bond of the porous silica film and the Si—H bond of the TMCTS proceeds insufficiently as shown in FIG. 4.

Figure 5:
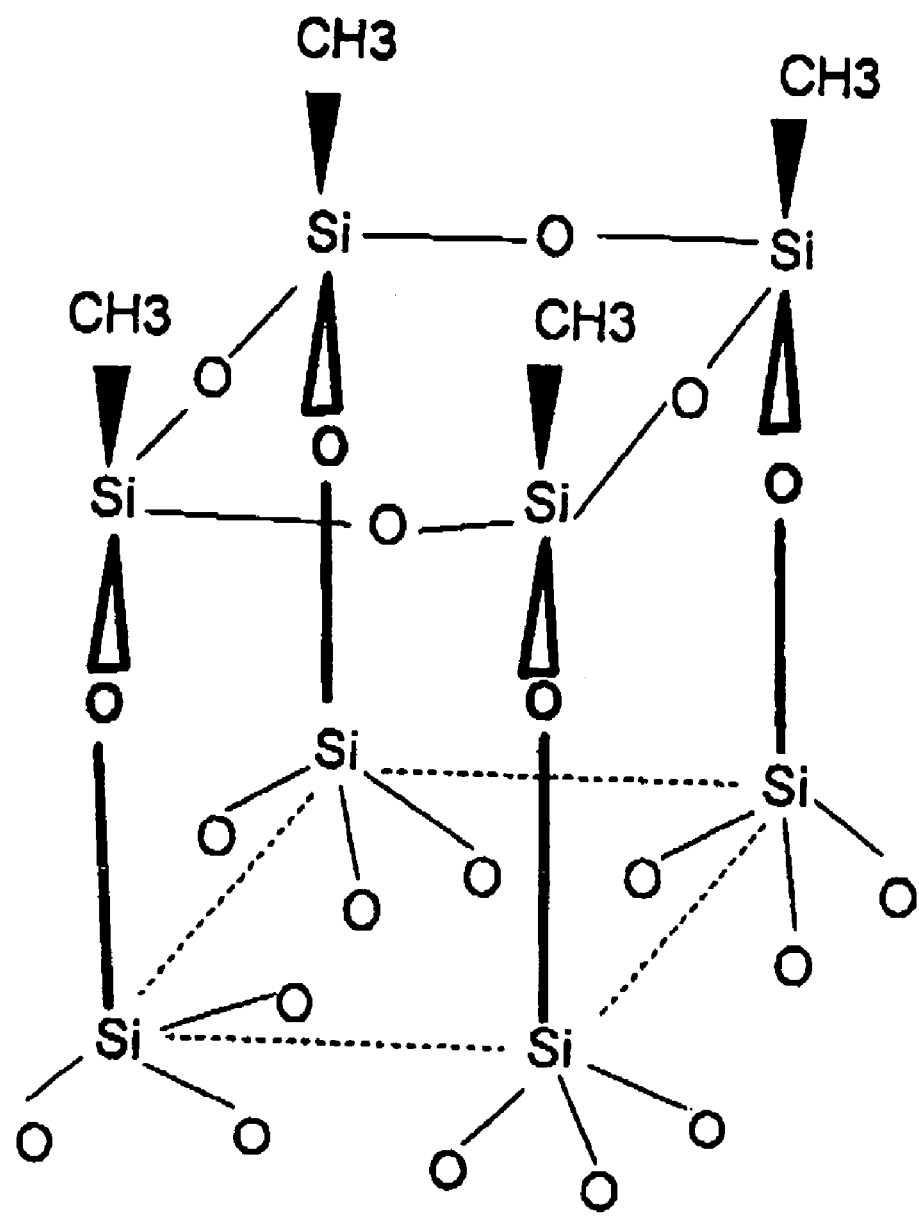
FIG. 5 is a structural drawing illustrating the film surface structure which has undergone the TMCTS treatment with a TMCTS having isolated stereoisomer (with ready advance of the reaction of the Si—OH on the film surface and TMCTS).

In contrast, when the TRACTS which has undergone isolation of the stereoisomers is used, as shown in FIG. 5, the reaction between the Si—OH bond of the porous silica film and the Si—H bond of the TMCTS proceeds readily.

EXAMPLE 1

A commercially available TMCTS having undergone no isolation of stereoisomers was secured and subjected to separation of stereoisomers by chromatography using a column of silica gel and the residue of the chromatography was distilled to expel a remaining impurity and produce a raw material containing 15% of "a stereoisomer having all the four hydrogen atoms forming an Si—H bond fall on the same side relative to an Si—O ring plane." This product was used as the forming material 2 in this example.

During the chromatographic isolation of stereoisomers, the portion of the liquid which spent a long time after it has passed through the column till it had been detected for collection was used as a sample for chromatographic analysis again. By this analysis, the area of the peak (the peak requiring the longest time till detection) for the stereoisomer having all the four hydrogen atoms forming the Si—H bond fall on the same side relative to the Si—O bond ring plane, was found to be 15% of the whole peak area of the TMCTS.

Incidentally, the commercially available TMCTS which had undergone no isolation of stereoisomers contained 12.5% of "the stereoisomer having all the four hydrogen atoms forming an Si—H bond fall on the same side relative to the Si—O ring plane." It was used as the forming material 1 in Comparative Example.

Further, the forming material 3 and the forming material 4 having concentrations respectively of 23% and 34% were obtained by repeating the chromatographic separation of stereoisomers and increasing stepwise the peaks for the "stereoisomers having all the four hydrogen atoms forming an Si— bond fall on the same side relative to the Si—O ring plane."

Figure 6:
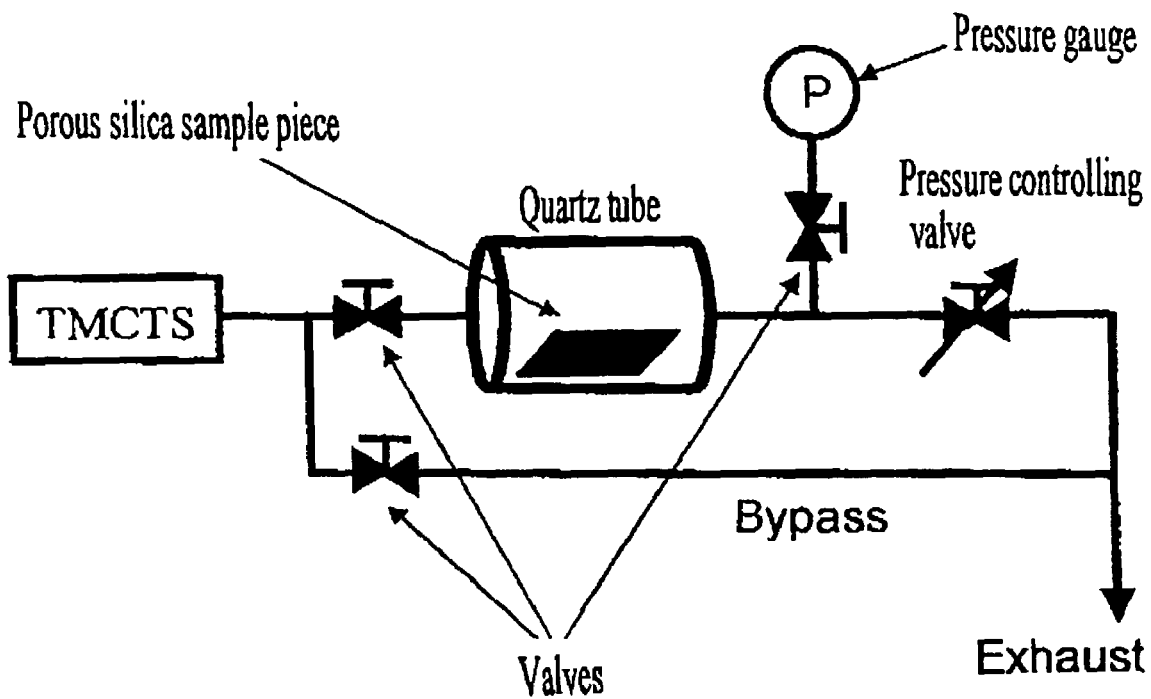
FIG. 6 is a structural drawing of an apparatus used for the experiment of the TMCTS vapor treatment.

A vapor treating apparatus configured as illustrated in FIG. 6 was used in embodying this invention. A porous silica sample piece on a silicon substrate was placed in a quartz tube 20 mm in inside diameter and subjected to vacuum evacuation and heated as well to 400° C. with an external electric heater. The temperature of the sample was monitored and controlled with a thermocouple.

Figure 7:
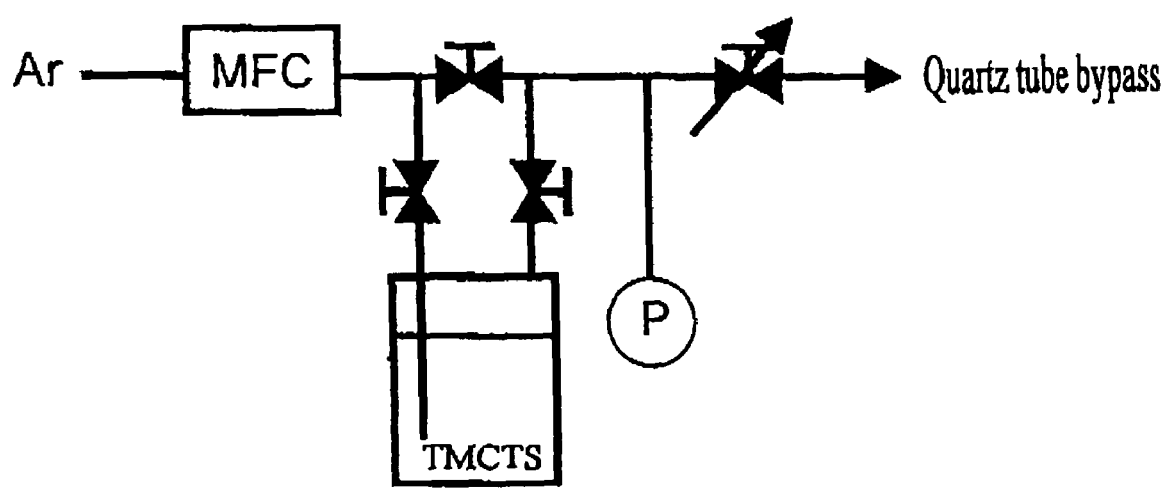
FIG. 7 is a detailed explanatory diagram of the TMCTS supply system.

The TMCTS gas supplying part appearing in FIG. 6 is illustrated in FIG. 7. The liquid sample was vaporized by bubbling with argon, an inert gas. The vaporized sample was introduced into a quartz tube including a heated sample. The reaction pressure (10 kPa) was controlled by regulating the flow rate of argon (10 sccm) with a mass flow controller (MFC) and adjusting the conductance of the vacuum evacuation system with a valve.

The film obtained in consequence of the gas treatment was evaluated by means of Fourier transform infrared spectroscopy (FTIR), capacitance-voltage measurement resorting to the mercury probing technique, x-ray reflectance measurement technique and surface acoustic wave technique.

Porous silica films were prepared, subjected to gas annealing treatments using the TMCTSs of the comparative example and the working example mentioned above, and tested for elastic modulus. Consequently, the forming material 1 of the comparative example was found to have 3.1 GPa and the forming material 2 of the working example 3.6 GPa respectively. The dielectric constant of the forming material 1 of the comparative example was found to be 1.99 and that of the forming material 2 of the working example 1.94. The vibrational spectra due to the OH in the neighborhood of 3200 to 3700 cm$^{-1}$ of the FTIR spectroscopy were hidden by the base line and were below the limit of detection in both the samples. Further, the magnitudes of elastic modulus and dielectric constant found for the forming material 3 and the forming material 4 of the working example which had high concentrations of "stereoisomer having all the four hydrogen atoms forming the Si—H bond fall on the same side relative to the Si—O ring plane" were respectively 4.1 GPa, 4.6 GPa, 1.92 and 1.90.

Figure 8:
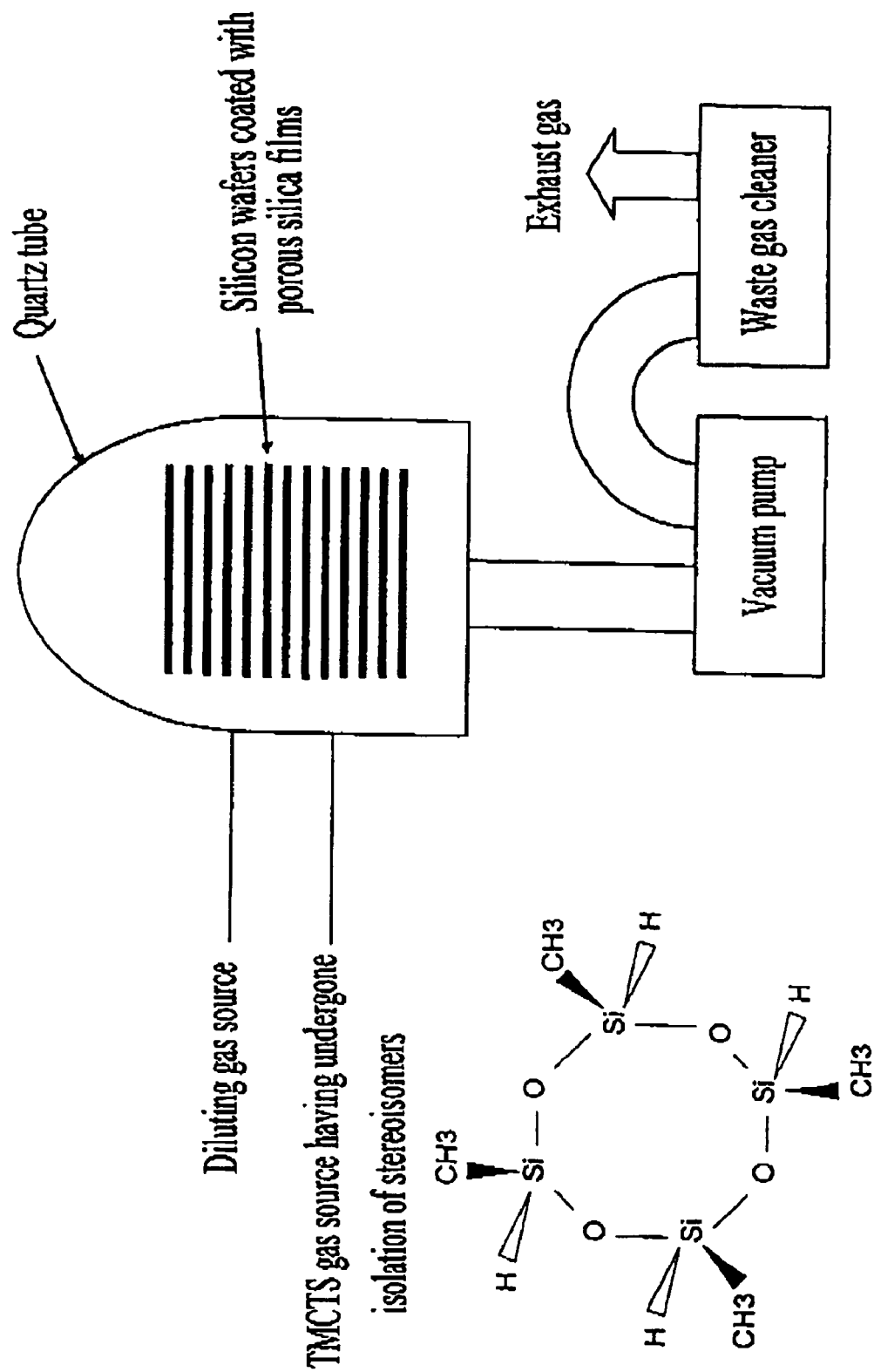
FIG. 8 is an explanatory diagram illustrating an example of the structure of an apparatus for implementing this invention.

The reduction of this invention to practice may be accomplished, for example, by the TMCTS vapor treatment performed at about 400° C. in an apparatus configured as illustrated in FIG. 8 in consideration of productivity.

This invention is capable of providing a material for forming a low-dielectric-constant film enjoying low hydrophobicity and excellent strength and, therefore, can be utilized for enhancing the function of an integrated circuit in the field of semiconductors.

What is claimed is:

1. A material for forming a low-dielectric-constant film, containing in a stereoisomer of a cyclic siloxane substance represented by general formula, $$(SiHR^1O)_L(SiHR^2O)_m(SiHR^3O)_n$$

(wherein $R^1$, $R^2$ and $R^3$ may be identical or not identical and individually denote $C_aH_{2a+1}$, $C_bH_{2b+1}O$, $CF_3(CF_2)_c(CH_2)_d$, $C_bH_{2c-1}$, $C_6H_5$ or a halogen atom, a denotes an integer of 1 to 3, b an integer of 1 to 3, c an integer of 0 to 10, d an integer of 0 to 4, e an integer of 2 to 4, L an integer of 0 to 8, m an integer of 0 to 8, n an integer of 0 to 8, and a relation of $3 \leq L+m+n \leq 8$ is satisfied), not less than $120/2^{L+m+n-1}\%$ and not more than 100% of a stereoisomer having all (L+m+n) number of hydrogen atoms forming an Si—H bond fall on a same side relative to an Si—O ring plane.

2. A material for forming a low-dielectric-constant film according to claim 1, wherein the cyclic siloxane substance is 1,3,5,7-tetramethyl cyclotetrasiloxane (TMCTS) and contains in all stereoisomer molecules of the TMCTS not less than 15% and not more than 100% of stereoisomer having all four hydrogen atoms forming an Si—H bond fall on the same side relative to the Si—O ring plane.

3. A method for forming a low-dielectric-constant film, comprising forming a porous insulating film utilizing the substance set forth in claim 1 or claim 2.

* * * * *